United States Patent
Beaulieu et al.

(10) Patent No.: US 6,719,517 B2
(45) Date of Patent: Apr. 13, 2004

(54) SUBSTRATE PROCESSING APPARATUS WITH INDEPENDENTLY CONFIGURABLE INTEGRAL LOAD LOCKS

(75) Inventors: David R. Beaulieu, Groton, MA (US); Douglas R. Adams, Pepperill, MA (US); Mitchell Drew, Portsmouth, NH (US); Peter Van Der Meulen, Newburyport, MA (US)

(73) Assignee: Brooks Automation

( * ) Notice: Subject to any disclaimer, the term of this patent is extended or adjusted under 35 U.S.C. 154(b) by 0 days.

(21) Appl. No.: 10/006,263

(22) Filed: Dec. 4, 2001

(65) Prior Publication Data

US 2003/0103836 A1 Jun. 5, 2003

(51) Int. Cl.$^7$ .............................................. B65G 49/07
(52) U.S. Cl. ....................................... 414/217; 414/939
(58) Field of Search .................................. 414/217, 939

(56) References Cited

U.S. PATENT DOCUMENTS

| | | | | |
|---|---|---|---|---|
| 4,341,582 A | * | 7/1982 | Kohman et al. ............ 156/345 |
| 5,611,655 A | | 3/1997 | Fukasawa et al. .......... 414/217 |
| 5,613,821 A | * | 3/1997 | Muka et al. ................ 414/217 |
| 6,050,891 A | * | 4/2000 | Nering ....................... 454/187 |
| 6,244,811 B1 | * | 6/2001 | Kroeker et al. ............. 414/217 |
| 6,375,746 B1 | * | 4/2002 | Stevens et al. ............. 118/719 |

FOREIGN PATENT DOCUMENTS

JP         2001-319885       * 11/2001

* cited by examiner

Primary Examiner—Steven A. Bratlie
(74) Attorney, Agent, or Firm—Perman & Green, LLP; Richard Pickreign

(57) ABSTRACT

A substrate processing apparatus comprising a frame, at least one processing module, and a substrate transport apparatus. The frame defines a first chamber with outer substrate transport openings for transporting substrates between the first chamber and an exterior of the frame. The processing module is connected to the exterior of the frame. The processing module communicates with the first chamber of the frame through at least one of the outer openings. The substrate transport apparatus is connected to the frame for transporting substrates between the first chamber and the processing module exterior to the frame. The frame has a second integral chamber formed therein. The second integral chamber communicates with the first chamber through an internal substrate transport opening of the frame. The second integral chamber of the frame has a selectable configuration from a number of predetermined configurations. The configuration of the second integral chamber to the frame is selected in accordance with a predetermined characteristic of the substrate processing apparatus.

8 Claims, 3 Drawing Sheets

SUBSTRATE PROCESSING APPARATUS WITH INDEPENDENTLY CONFIGURABLE INTEGRAL LOAD LOCKS

BACKGROUND OF THE INVENTION

1. Field of the Invention

The present invention relates to a substrate processing apparatus and, more particularly, to a substrate processing apparatus having independently configurable integral load locks.

2. Prior Art

Various substrate processing apparatus are known in the prior art. One example of a substrate processing apparatus of the prior art is provided in U.S. Pat. No. 5,611,655, which discloses a vacuum processing apparatus with a convey chamber having an airtight structure, preliminary vacuum chambers connected to the convey chamber structure, vacuum process chambers connected to the convey chamber structure, and an arm member for conveying members between the various chambers. The configuration of the aforementioned vacuum processing apparatus typifies the configurations of substrate processing apparatus in the prior art, wherein the various apparatus chambers (e.g. vacuum chambers, pre-vacuum or load lock chambers, and processing chambers) have discrete structures which are connected to each other. Providing separate discrete structures for the chambers of the substrate processing apparatus facilitates fabrication and assembly of the chambers and systems associated with each of the chambers. Nevertheless, having the chambers of the substrate processing apparatus as discrete structures results in substantial duplication of structure of the apparatus which increases the manufacturing cost of the apparatus. Moreover, a substrate processing apparatus with its various chambers having discrete structures, as in the prior art, has a large footprint thereby reducing the number of apparatus which may be installed in a given substrate production facility and limiting the substrate production of the facility by comparison to a substrate processing apparatus with a small footprint. The present invention provides an integral structure with integral chambers to overcome the problems of the prior art as will be described in greater detail below.

SUMMARY OF THE INVENTION

In accordance with a first embodiment of the present invention, a substrate processing apparatus is provided. The substrate processing apparatus comprises a frame, at least one processing module, and a substrate transport apparatus. The frame defines a first chamber with outer substrates transport openings for transporting substrates between the first chamber and an exterior of the frame. The processing module is connected to the exterior of the frame and communicates with the first chamber of the frame through at least one of the outer openings. The substrate transport apparatus is connected to the frame for transporting substrates between the first chamber and the processing module exterior to the frame. The frame has a second integral chamber formed therein. The second integral chamber in the frame communicates with the first chamber through an internal substrate transport opening of the frame. The second integral chamber of the frame has a selectable configuration from a number of predetermined configurations. The configuration of the second integral chamber is selected in accordance with a predetermined characteristic of the substrate processing apparatus.

In accordance with a second embodiment of the present invention, a substrate processing apparatus is provided. The substrate processing apparatus comprises a frame, at least one processing module, a substrate transport apparatus, and a predetermined interchangeable module. The frame defines a first chamber with outer substrate transport openings for transporting substrates between the first chamber and an exterior of the frame. The frame has at least one second integral chamber formed therein. The second integral chamber of the frame communicates with the first chamber through an internal substrate transport opening in the frame for transporting substrates between the second integral chamber and the first chamber of the frame. The processing module is connected to the exterior of the frame and communicates with the first chamber of the frame through at least one of the outer openings. The substrate transport apparatus is connected to the frame for transporting substrates between the first chamber of the frame and the processing module. The predetermined interchangeable module is removably connected to the frame and located in the second integral chamber of the frame. The predetermined interchangeable module corresponds to a predetermined operation of the substrate processing apparatus.

In accordance with the method of the present invention, a method for configuring a substrate processing apparatus is provided. The method comprises the steps of providing the apparatus with a frame, selecting a predetermined interchangeable module, and installing the selected predetermined interchangeable module in the frame. The apparatus frame defines a first chamber with outer substrate transport openings for transporting substrates between the first chamber and processing modules outside the frame. The frame has a second integral chamber formed therein. The second integral chamber communicates with the first chamber through an internal substrate transport opening in the frame. The predetermined interchangeable module is selected from at least one of a passive load lock module, an active load lock module, a batch load lock module, and an active heater module in accordance with a predetermined operating condition of the substrate transport apparatus. The selected predetermined interchangeable module is installed in the second integral chamber of the frame.

In accordance with a third embodiment of the present invention, a substrate processing apparatus is provided. The substrate processing apparatus comprises a vacuum section, at least one processing module connected to the vacuum section, and a substrate transport apparatus. The vacuum section has a frame forming a vacuum chamber. The processing module is connected to the vacuum section to communicate with the vacuum chamber. The substrate transport apparatus is connected to the frame for moving a substrate between the vacuum chamber and the processing module. The frame of the vacuum section forms at least one load lock chamber integral to the vacuum section for transiting the substrate between a vacuum atmosphere maintained in the vacuum chamber and a different atmosphere outside the vacuum section.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
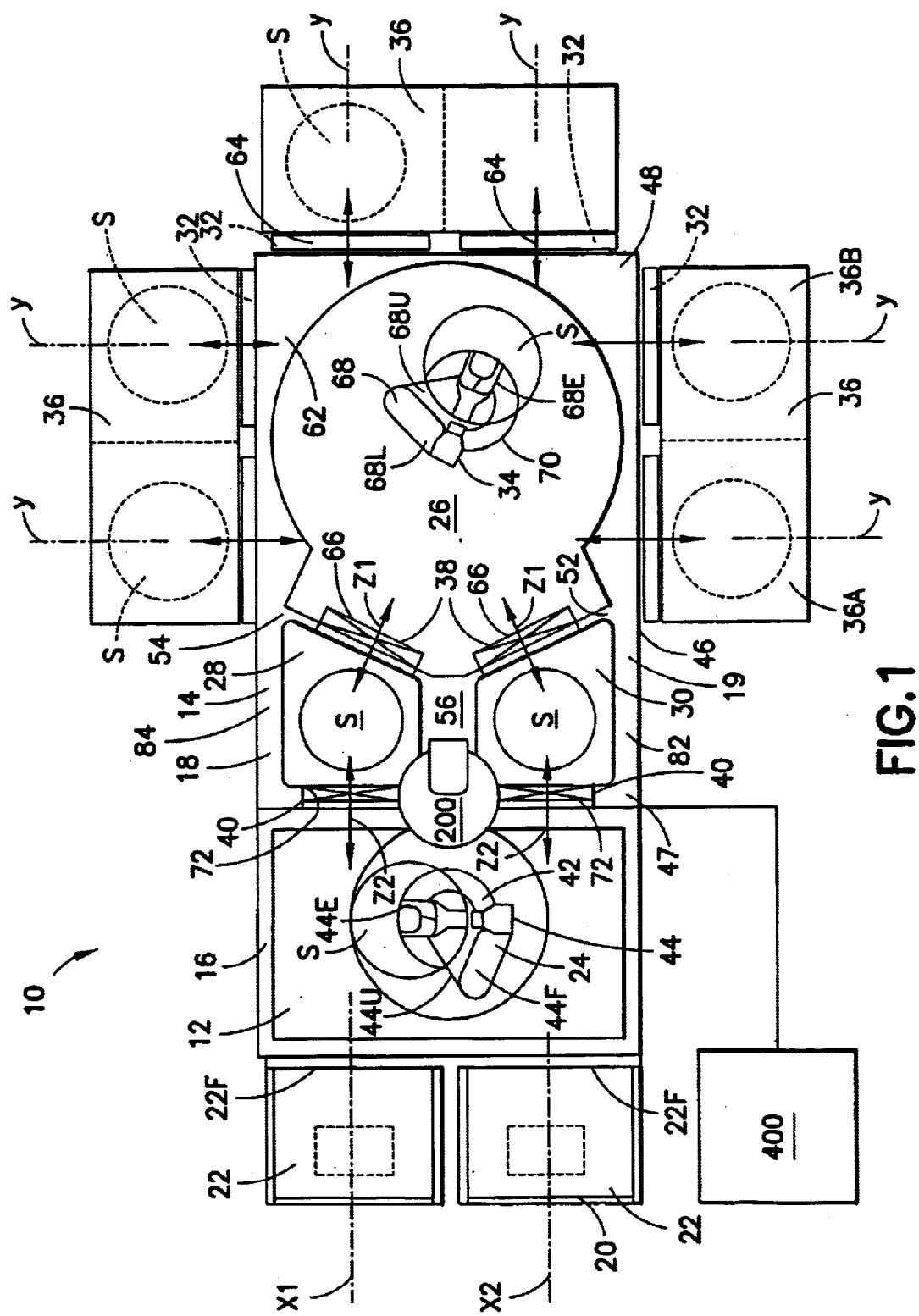
FIG. 1 is a schematic top plan view of a substrate apparatus incorporating features of the present invention.

Referring to FIG. 1, there is shown an exploded perspective view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The substrate processing apparatus 10 generally comprises a front or atmospheric section 12, and an adjoining back or vacuum section 14. The front section 12 generally has a frame 16, substrate holding cassettes 22, and a substrate transport apparatus 24. The back section 14 has a main section 18, processing modules 36, and a vacuum substrate transport apparatus 34. The frame 16 of the front section 12 may be adjacent of the back section 14 of the substrate processing apparatus 10. The front section frame 16 generally supports a number of the substrate holding cassettes 22 which hold a number of substrates S therein. The substrates may be for example, semiconductor wafers, flat panel displays substrates, or any other suitable type of substrates. The frame 16 of the front section 12 is open to atmosphere. The atmospheric substrate transport apparatus 24 is mounted to the frame 16 for transporting substrates between the holding cassettes 22 and the vacuum back section 14 of the apparatus 10. The main section 18 of the back section 14 includes a central chamber 26, and intermediate chambers 28, 30. Processing modules 36 are disposed generally around the main section 18 and communicate with the central chamber 26 through openings in the exterior of the main section. The intermediate chambers 28 communicate with the central chamber 26 through internal openings in the main section. The main section 18 also has outer openings allowing the intermediate chambers 28, 30 to communicate with the adjoining atmospheric front section 12. The vacuum substrate transport apparatus 34 is mounted in the main section for transporting substrates through the central chamber 26 between the intermediate chambers 28 and the processing modules 36. The processing modules 36 include one or more chambers with appropriate systems to perform processes such as for example, sputtering, coating, etching, soaking, or any other suitable process on substrates deposited in the chambers. The central chamber 26 of the back section 14 is maintained substantially in a vacuum to prevent contamination of substrates when being transported between the intermediate chambers 28, 30 and processing modules 36.

Outer openings 32 of the back section may be closed to isolate the central chamber 26 from the processing modules 36. Internal openings 38 may be closed to isolate the central chamber 26 from intermediate chambers 28, 30 and outer openings 40 of main section 18 may be closed to isolate the intermediate chambers from atmospheric conditions outside the chambers. The substrate processing apparatus 10 further includes a controller 400 which controls the operation of the apparatus 10. In accordance with commands from the controller 400, the atmospheric transport apparatus 24 transports new substrates from cassettes 22 to intermediate chambers 28, 30 and returns processed substrates from the intermediate chambers to the cassettes 22. One or both of the intermediate chambers 28, 30 may be configured as a load lock as will be described in greater detail below. The controller 400 cycles the load lock and operates the vacuum substrate transport apparatus 34 to transport substrates from intermediate chambers 28, 30 through the central chamber to processing modules 36. The substrates are then processed and returned through the intermediate chambers to cassettes 22.

Still referring to FIG. 1, in the preferred embodiment, the frame 16 of the front section 12 supports two cassettes 22 from the front end 20 of the frame. The cassettes 22 are held in a generally side by side configuration. The cassettes may be front opening uniform pods (FOUP) which in the preferred embodiment are capable of holding about 26, 200/300 millimeter semiconductor substrates. In alternate embodiments, the front section frame may support any desired number of substrate holding cassettes. The cassettes may be of any suitable type and be capable of holding any desired number of substrates. In other alternate embodiments, the substrate holding cassettes may be also located on the sides of the front section frame as well as the front. Each cassette 22 has a front face 22F facing the frame 16 of the front section 12. The front face 22F has an opening (not shown) through which substrates S are removed and inserted into the respective cassette 22. As seen in FIG. 1, the atmospheric substrate transport apparatus 24 is mounted to frame 16 between the cassettes 22 and the back section 14 of the apparatus 10. In the preferred embodiment, the substrate transport apparatus 24 comprises a drive section 42 which moves an upper scara arm 44. A similar substrate transport apparatus is described in U.S. patent application Ser. No. 09/163,844 filed Sep. 30, 1998, which is incorporated herein by reference in its entirety. In alternate embodiments, the atmospheric substrate transport apparatus may be of any other suitable type such as for example frog leg substrate transport apparatus, or bi-symmetric transport apparatus. In the preferred embodiment, the drive section 42 of the transport apparatus 24 is fixedly mounted to the frame 16 with the center of the transport apparatus being between the side by side cassettes 22 (see FIG. 1). The drive section includes suitable drives (not shown) for vertically raising and lowering the scara arm 44. The scara arm 44 includes an upper arm link 44U, a forearm link 44L, and an end effector 44E for holding substrates thereon. The drive section 42 includes suitable drives (not shown) for articulating the scara arm links 44U, 44L, and end effector 44E to extend/retract the arm and to pivot the arm. The movement of the atmospheric substrate transport apparatus 24 is controlled by controller 400. The controller 400 operates the apparatus 24 to move substrates into and out of cassettes 22 through the front openings of the cassettes. On the commands from the controller 400, drive section 42 moves the scara arm vertically up or down to vertically align the end effector 44E with substrates S or with substrate shelves on cassettes 22. The scara arm 44 is then extended or retracted while pivoting the arm assembly so that the substrate held by end effector 44E moves along an axis X1, X2 into or out of the corresponding cassette 22. In alternate embodiments, the drive section of the atmospheric substrate transport apparatus may be moved on a carriage movably mounted to the frame of the front section so that the substrate transport apparatus may translate longitudinally or laterally relative to the frame.

In the preferred embodiment, the main section 18 of back section 14 has a frame 19 with a generally rectangular shape. The frame 19 has two side walls 46, a front wall 47, and a back wall 48 spanning therebetween. The frame 19 of the back section also includes internal partition walls 52, 54, 56 which subdivide the interior of the frame 19 of the back section 14 to form the central chamber 26 and the two integral intermediate chambers 28, 30. The frame 19 may be a one piece member such as for example, a casting or forging made from a suitable material such as aluminum. In alternate embodiments, the frame of the back section may be an integral structure comprising a number of members structurally interconnected to each other such as by welding, braising, or any other appropriate mechanical connection to form an integral structure. As seen in FIG. 1, the central chamber 26 is disposed at the rear of the frame 19 between internal partition walls 52, 54 and to the back wall 48 of the frame. The frame 19 has seating surfaces around the perimeter 62 of the central chamber 26 for seating substantially air tight top and bottom covers 58, 60 to enclose the central chamber 26 (see also FIGS. 2–5). Side walls 46 have two adjacent substrate transport openings 32 formed therein allowing access through the side walls to the central chamber 26. The back wall 48 also has two substrate transport openings 32 formed therein. In the preferred embodiment, three processing modules 36 are connected to the side walls 46 and back wall 48 of the back section. Each processing module 36 may have two separate chambers 36A, 36B, each chamber communicating with the central chamber 26 of the back section 14 through a corresponding opening 32 in the side and back walls 46, 48. In alternate embodiments, the side walls and back wall of the central chamber may have any other suitable number of substrate transport openings and any suitable number of processing modules may be connected to the back section of the processing apparatus, each of the processing modules having any suitable number of processing chambers. For example, in the case where the side walls of the frame have two openings therein (similar to the preferred embodiment shown in FIG. 1) two separate processing modules, each with only one processing chamber therein, may be connected to the side walls. Slot valves 64 are mounted on the frame 19 at each of the openings 32. The slot valves 64 which may be solenoid valves, hydraulic valves, or any other suitable remote operated valves are opened and closed by the controller 400. Closing the slot valve 64 of a given opening 32 also closes the opening 32. The closed valve 64 forms a substantially airtight seal to isolate the central chamber 26 from the adjoining processing module 36. Opening the slot valve 64 allows free access for transporting a substrate between the processing module 36 and the central chamber 26 through the opening 32 in the frame. Each of the internal partition walls 52, 54 also have an opening 38 formed therein allowing access between the central chamber 26 and each intermediate chamber 28, 30. Each opening 38 in the internal partition walls 52, 54 also has a slot valve 66 for closing the opening and forming a substantially airtight seal between the corresponding intermediate chamber 28, 30 and the central chamber 26 when the slot valve is closed. The slot valve 66 may be substantially similar to slot valve 64 used at the openings 32 in the side walls and back wall of the back section 14. The slot valves 66 are cycled between the open and closed position by controller 400, and send a suitable signal to the controller to indicate the position of the valves.

In the preferred embodiment, the central chamber 26 of the back section 14 is maintained at a vacuum, though the central chamber may contain any other desired controlled atmosphere. The back section 14 preferably includes the appropriate systems and plumbing (not shown) for generating, and maintaining the vacuum in central chamber 26. By way of example, a high vacuum pump (not shown) may be mounted to the frame 19 and connected using suitable plumbing to an inlet in the chamber 26 to draw the desired vacuum condition in the chamber. The vacuum condition in the central chamber 26 may be regulated by controller 400 using the pump and appropriate monitoring devices (not shown) such as pressure gages capable of accurately registering the very low pressures which may exist in the vacuum chamber. In the preferred embodiment, the substrate transport apparatus 34 includes a drive section 70 and a scara arm 68 substantially similar to the atmospheric substrate transport apparatus 24. In alternate embodiments the drive section may drive any other suitable transport arm arrangement such as a frog leg linkage or bi-symmetric arm arrangement. The drive section 70 of the vacuum substrate transport apparatus 34 may be fixedly mounted to the frame or any other suitable member of the back section 14. The drive section 70 includes suitable motors (not shown) to rotate the scara arm 68, and articulate the upper arm link 68U, the lower arm link 68L and the end effector 68E in order to extend and retract the arm. The drive section 70 may also include a suitable drive for raising and lowering the scara arm 68. The controller 400 operates the drive section 70 to move substrate S held by the end effector 68E along axis Y through openings 32 into or out of a desired processing module 36. The scara arm 68 of the substrate transport apparatus 34 in the back section 14 is articulated by controller 400 to move a substrate S held by the end effector 68E along axis Z1 into or out of a desired intermediate chamber 28, 30 through internal openings 38.

As seen in FIG. 1, the front wall 47 of the back section frame 19 has two openings 40, one opening for each of the two intermediate chambers 28, 30 of the back section. Each opening 40 has a powered slot valve 72 similar to slot valves 64 for the outer openings 32 of the back section 14. Slot valves 72 are remotely operated by controller 400. The slot valves 72 are in the open position to provide access for moving substrates S through openings 40 between the corresponding intermediate chambers 28, 30 and the atmospheric front section 12 of the processing apparatus 10. Substrates S are moved into and out of the intermediate chambers 28, 30 through openings 40 using the scara arm 44 of the atmospheric substrate transport apparatus 24 of the front section 12. The scara arm 44 is rotated and extended or retracted to displace a substrate S on end effector 44E generally along axis Z2 as shown in FIG. 1. When the slot valves 72 are in a closed position, the openings 40 are closed. The closed slot valves 72 provide a substantially air tight seal isolating the respective intermediate chambers 28 from the atmosphere outside of the back section 14 of the processing apparatus 10. The slot valves 72 send a suitable signal to the controller 400 to indicate when the valves are open or closed.

Referring also to FIGS. 2–5, the intermediate chambers 28, 30 integrally formed in the frame 19 of back section 14 are preferably open top and bottom to admit therein one of a number of interchangeable drop-in modules 74–80. In alternate embodiments, the frame of the back section may have any other suitable type of passage to allow installation of an interchangeable module in each of the intermediate chambers of the frame. The drop-in modules 74–80 installed in the intermediate chambers 28, 30 may be supported from the walls 46, 47, 52, 54, 56 of the frame 19. For example, the frame walls 46, 47, 52, 54, 56 may have an upper seating surface 82, 84 around each of the intermediate chambers 28, 30 for seating a mating flange (not shown) of the module 74–80 located in the chamber 28, 30. Each drop in module 74–80 forms a substantially airtight fit with the frame 19 when installed in the intermediate chamber 28, 30 and secured to the frame of the back section 14. Machine screws (not shown) or any other suitable mechanical fasteners may be used to secure the drop-in module 74–80 located in the intermediate chamber 28, 30 to the frame 19.

Figure 2:
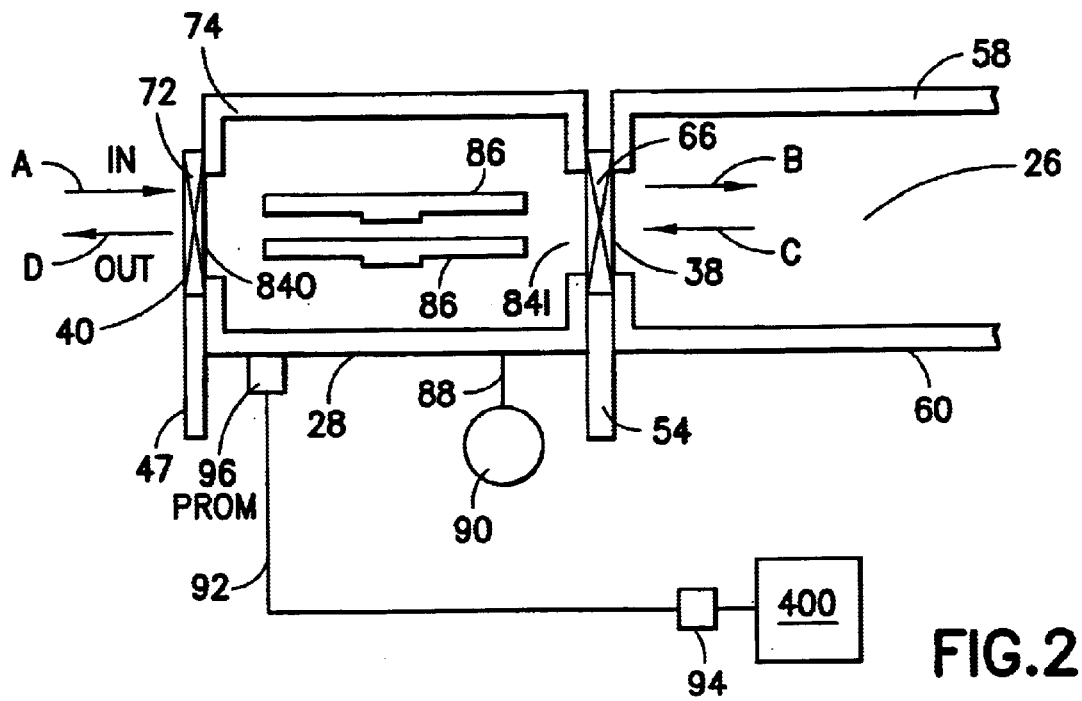
FIG. 2 is a first partial cross-sectional view of a back section of the substrate processing apparatus in FIG. 1, the back section having a first selectable configuration wherein a passive pass-through load lock module is installed on the back section.

FIG. 2, shows a cross-section of the left integral intermediate chamber 28 of back section 14 with load lock module 74 installed therein. Load lock module 74 is a passive pass-through load lock. The load lock module has outer and inner entry ports 84O, 84I. When installed in chamber 28, the outer entry port 84O of module 74 is generally aligned with the corresponding opening 40 in the front wall 47, and the inner port 84I is generally aligned with the corresponding opening 38 and the internal wall 54 of the back section 14. In the preferred embodiment, load lock module 74 includes two stationary substrate support shelves 86 for supporting substrates in the load lock module, though the load lock module may have any suitable number of support shelves.

The load lock module 74 preferably also includes all appropriate plumbing 88 and systems 90 for roughing the load lock to substantially the same vacuum condition as the central chamber 26 and for restoring the load lock to atmospheric conditions present in the front section 12. By way of example, the plumbing 88 may include piping/tubing (not shown) removably connected, such as by using a union or any other suitable mechanical fitting, to the high vacuum pump (not shown) used for providing the central chamber 26 with the vacuum condition. A suitable valve (not shown) in the plumbing 88 may be used to isolate the load lock 74 from the vacuum pump. The valve may be remotely operated by the controller 400. Otherwise a roughing only pump may be included in the systems 90 of load lock module 74, which pump is activated by controller 400 to rough-out the load lock. The load lock plumbing 88 may further have an intake pipe and valve (not shown) for reintroducing, under control by controller 400, atmospheric conditions into the load lock.

The load lock module 74 preferably has suitable wiring 92 with a connector 94 for connecting the load lock wiring to the controller 400 of the processing apparatus. The controller 400 may access and operate the various plumbing components and systems using wiring 92 of the load lock module. In addition, the controller 400 may access, upon connecting connector 94 to the controller, a programmable read-only memory 96 (PROM) of the load lock module 74. When accessed, the PROM 96 sends a signal to the controller 400 indicating to the controller that the load lock module 74 is a passive pass-through load lock. In alternate embodiments, the user of the processing apparatus may input appropriate commands in the controller 400 to indicate to the controller of the processing apparatus that the module in the intermediate chamber of the back section is a passive path through load lock module. The controller 400 may load a suitable program from internal memory (not shown) to operate the substrate processing apparatus 10 appropriately. For example, controller 400 may close slot valves 66 to isolate the central chamber 26 from the intermediate chamber 28 holding load lock module 74. The controller 400 controllably introduces atmospheric conditions in the load lock module 74, and then opens the outer slot valve 72 between the intermediate chamber 28 and the atmospheric front section 12. The controller 400 operates the atmospheric substrate transport apparatus 24 to extend scara arm 44 at the appropriate vertical height and capture a substrate S in the FOUP cassette 22 held by front section 12. The substrate S captured by the end effector 44E on the scara arm 44 is withdrawn along axis X1, X2 (see FIG. 1) from the FOUP cassette 22 and inserted along axis Z2 through opening 40 into the passive load lock module 74 in intermediate chamber 28 (as indicated by arrow A in FIG. 2). Prior to being inserted into the intermediate chamber 28, the substrate S may be transported, if desired, with the scara arm 44 to a substrate aligner 200 mounted on the exterior of the back section 14 (see FIG. 1). After inserting the substrate S into load lock module 74, the controller 400 releases the substrate S held by end effector 44E on a stationary support shelf 86. The controller 400 is programmed with the three dimensional location of the support shelves 86 in order to properly position the substrate S held by the end effector onto the support shelves 86. The controller 400 preferably repeats the after mentioned process to place a second substrate S on the second shelf 86 on the load lock module 74. The controller 400 may close slot valve 72 isolating the load lock from the front-end section 12 and proceed to rough the load lock. The controller 400 may have programming with interlocks which prevent closing the slot valve 72 until the controller 400 receives an indication that the scara arm 44 has been retracted, and commence roughing the load locks 74 after the indication that slot valves 72 is closed. After roughing the load lock 74, the controller 400 opens inner slot valve 66 (an interlock in the controller prevents opening the inner slot valve until the load lock has substantially the same vacuum condition as present in the central chamber 26 of the back section). The controller 400 articulates the scara arm 68 of the vacuum substrate transport apparatus 34 to extend its end effector 68E through opening 38 into intermediate chamber 28 and capture a substrate S on one of the shelves 86 of the load lock module 74. The substrate is removed from the intermediate chamber 28 along axis Z1 (as indicated by arrow B in FIG. 2), transported by the scara arm 68 to a desired chamber of a processing module 36, and placed through opened outer slot valve 64 into the processing module chamber. The outer slot valve 64 may then be closed and substrate processing may commence. Processed substrates are returned in a substantially reversed manner from that noted above from the processing module 36 to the load lock module 74 (as indicated by arrow C in FIG. 2) in the intermediate chamber 28. The number of processing modules 36 on the back section 14 allow several substrates to be in different stages of processing. Accordingly, the vacuum substrate transport apparatus 34 may, after start up, sequentially transport new substrates to processing modules 36 and process substrates back to load lock 74. When two process substrates S are located on the support shelves 86 of the load lock module 74, the controller 400 closes the inner slot valve 66 (an interlock in the controller prevents the closing of the valve until the controller receives a signal from the substrate transport apparatus 34 that the arm 68 is retracted) thereby isolating the central chamber 26 from the intermediate chamber 28. The controller 400 then re-introduces atmospheric conditions into the load lock module 74 and opens the outer slot valve 72 to allow removal of the now processed substrate S in the load lock with the atmospheric substrate transport apparatus 24. The processed substrates are removed again using the scara arm 44 from the load lock (as indicated by arrow D in FIG. 2) and returned to a FOUP cassette 22. The entire process may then be repeated with new substrates.

Figure 3:
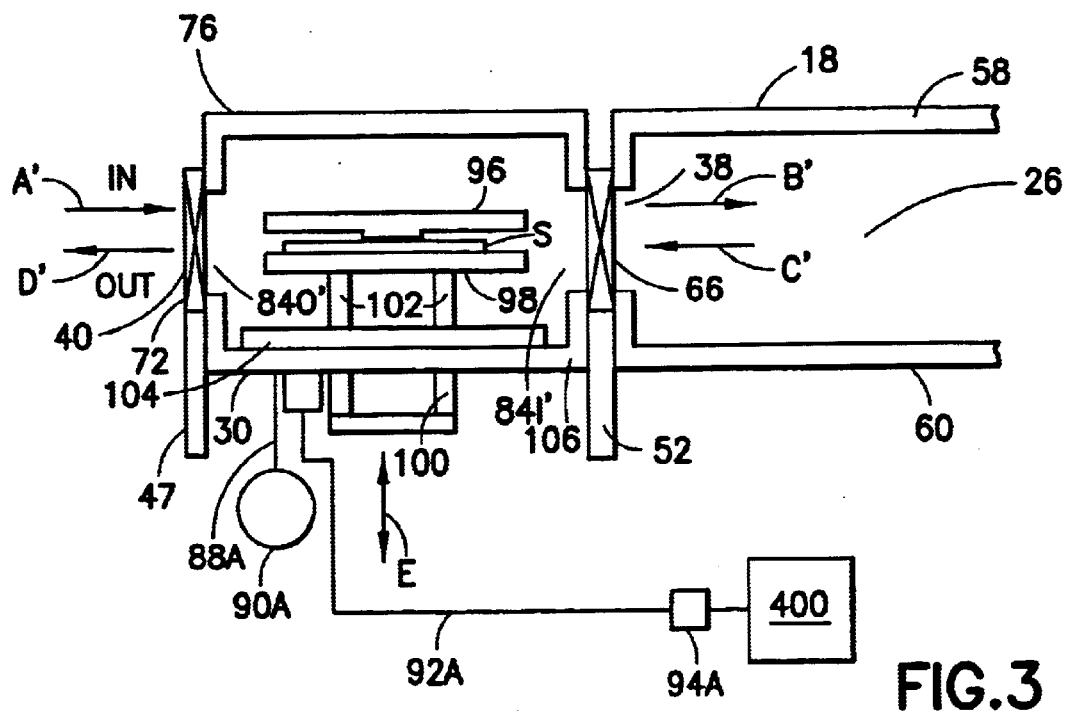
FIG. 3 is a second partial cross-sectional view of the back section having a second selectable configuration wherein an active pass-through load lock is installed on the back section.

FIG. 3 shows a cross-section of the right integral intermediate chamber 30 of back section 14 with an active pass-through load lock module 76 mounted therein. The active pass-through load lock module 76 is interchangeable with the passive pass-through load lock module 74, and each may be installed in either the left or right intermediate chambers 28, 30 integral to the back section 14 of the apparatus 10. The active passthrough load lock module 76 is shown installed in the right intermediate chamber 30 for example purposes only. The active pass-through load lock 76, shown in FIG. 3, is substantially similar to the passive load lock module 74 as described above and shown in FIG. 2 except as otherwise noted below. Similar features of the modules 74, 76 in FIGS. 2 and 3 are similarly numbered. The active load lock module 76 preferably has one stationary substrate support shelf 96 and a movable substrate support shelf 98. In alternate embodiments, the active load lock module may have any suitable number of stationary shelves therein. The movable support shelf 98 may be connected by connecting shafts 102 to a drive unit 100 which moves the movable shelf up and down in the load lock module 76 as indicated by arrow E in FIG. 3. The drive unit 100 may include a hydraulic or pneumatic powered mechanism, mounted to the bottom 106 of the module 76, which when pressurized causes the shafts 102 to move up and down. Alternatively, the drive unit may be an electric motor turning a pinion gear which in turn may move a rack connected to the movable shelf supporting shafts. The controller 400 includes program instructions for operating the drive unit 100 for moving the shelf 98 up and down. The controller 400 sends the commands via connectorized wiring 92A to the drive unit 100. The active load lock module 76 preferably includes a cooling plate 104 mounted on the bottom 106 of the module. The cooling plate 104 may include one or more cooling passages (not shown) through which a cooling fluid is circulated to control the mean temperature of the cooling plate as desired. In alternate embodiments, the temperature of the cooling plate may be controlled by any other suitable means such as by radiator fins, cooling fans, conduction to the frame, or a combination thereof. The cooling plate 104 may be used to cool processed substrates placed on the movable shelf 98. For example, a processed substrate S may be inserted into load lock module 76 using scara arm 68 as described previously with reference to the passive load lock module 74. The substrate S may be placed by the end effector 68E on the movable shelf 98 of the active load lock module 76 (see FIG. 3). The movable shelf 98 may then be lowered to seat on the cooling plate 104 which is maintained at a desired temperature which is lower than the temperature of the substrate S on shelf 98. The shelf 98, which is made from a suitable thermally conductive material, such as aluminum alloy or steel, allows thermal conduction between the substrate S on the shelf and the cooling plate 104. The substrate S is cooled for a predetermined period of time sufficient to reduce the substrate temperature to a desired level based on the cooling capacity of the thermal plate. Cooling times may be reduced by isolating the load lock module from the vacuum chamber 26 and introducing a low pressure gas between the cooling plate 104 and movable shelf 98 to improve conduction therebetween. After the substrate S has been cooled, the movable shelf 98 is raised, the load lock module is vented to atmosphere, the outer valve 72 is open, and the substrate S is removed with the atmospheric substrate transport apparatus 24 for transport to FOUP cassettes 22 (see FIG. 1).

Figure 4:
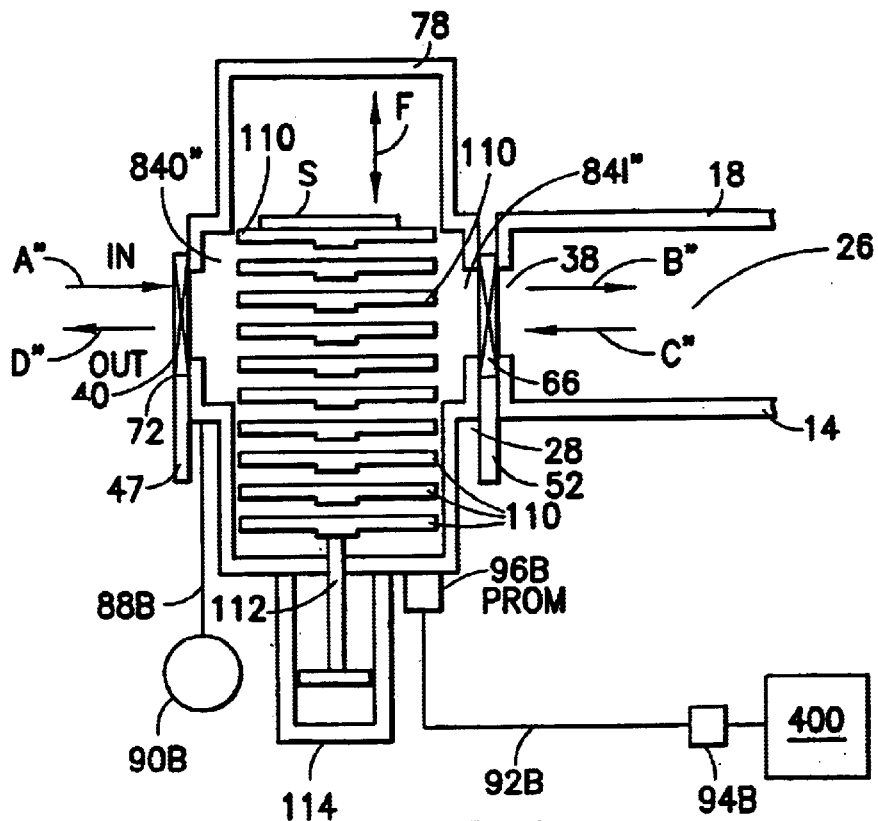
FIG. 4 is a third partial cross-sectional view of the back section having a third selectable configuration wherein a batch load lock module is installed on the back section.

FIG. 4 shows another cross-sectional view of the left integral chamber 28 of the back section 14. In this case a batch load lock module 78 is mounted therein. The batch load lock module 78 is interchangeable with the passive or active load lock modules 74, 76 (see FIGS. 2 and 3) and may be installed in either the left or right intermediate chambers 28, 30. The batch load lock module 78 is shown in FIG. 4 mounted in the left chamber 28 for example purposes only. The batch load lock module 78 is, except as otherwise described below, substantially similar to both the active and passive load lock modules 74, 76 in FIGS. 2 and 3, with similar features of the modules having similar reference numbers. The batch load lock module 78 has all the appropriate plumbing 88B and systems 90B for cycling the conditions inside the intermediate chamber 28 between atmospheric, and the vacuum conditions in the central chamber 26 of the back section 14. The module 78 has appropriate wiring 92B with connector 94B for connecting controller 400 to the module PROM 96B which signals the controller that the module installed in the chamber is a batch load lock module. In the preferred embodiment, the batch load lock module 78 has about 26 substrate support shelves 110, though the batch load lock module may have any other suitable number of support shelves. As shown in FIG. 4, the support shelves 110 are fixedly mounted to a movable shaft 112. The shaft 112 is connected to a drive mechanism 114 capable of moving the shaft 112, and hence the shelves 110, up and down relative to the module 78 as indicated by arrow F. The drive mechanism 114 may be any suitable mechanism for raising and lowering shaft 112 supporting shelves 110 such as for example a pneumatically, or hydraulically powered piston, or an electric gear drive. The size of the outer and inner openings 40, 38 in the frame 19 allows the end effector 44E, 68E of both the atmospheric substrate transport apparatus 24 and the vacuum transport apparatus 34 access to a portion of the 26 shelves 110 in the batch load lock module 78. Accordingly, the controller 400 is programmed to move the shelves 110 up and down to allow the substrate transport apparatus 24, 34 to access all the shelves 110 through the openings 40, 38 in the frame. By way of example, when loading new substrates S into the batch load lock modules 78, the support shelves 110 may be initially in a down position with some of the upper shelves being accessible through opening 40. Outer slot valves 72 is open and inner slot valve 66 is closed. The atmospheric substrate transport apparatus 44 sequentially loads substrates S on accessible shelves 110 through opening 40 in frame 19 and opening 84O" in module 78 (as indicated by arrow A" in FIG. 4). The shelves 110 are then raised to allow the transport apparatus 24 to access previously inaccessible shelves in opening 40 in frame 18. Substrate loading operations may then continue with the substrates being placed on the now accessible shelves 110. The above steps may be repeated until all 26 shelves 110 and modules 78 have been loaded with substrates. The outer slot valve 72 may then be closed isolating the batch load lock 78 from atmospheric conditions. The load lock may then be roughed to vacuum conditions in the central chamber 26. The new substrates S and load lock module 78 are removed into the central chamber 26 in a substantially similar manner to the loading process. The inner slot valve 66 is opened and the vacuum substrate transport apparatus 34 sequentially removes substrates through opening 38, as indicated by arrow B" in FIG. 4, from the accessible shelves 110. The shelves 110 are incrementally lowered by drive unit 114 to expose additional shelves 110 through opening 38. The process is repeated until all substrates are removed from the load lock module 78. The loading and unloading of batch load lock 78 with processed substrates is performed in substantially the same way except the process substrates are first loaded into module 78 from the back section 14 and unloaded after venting the load lock to atmosphere through outer opening 40 into the front section 12 (see FIG. 1). Prior to removing the process substrates from the batch load lock module 78, the load lock may be used for batch cooling of the processed substrates by purging load lock module 78 after the load lock is vented to atmosphere.

Figure 5:
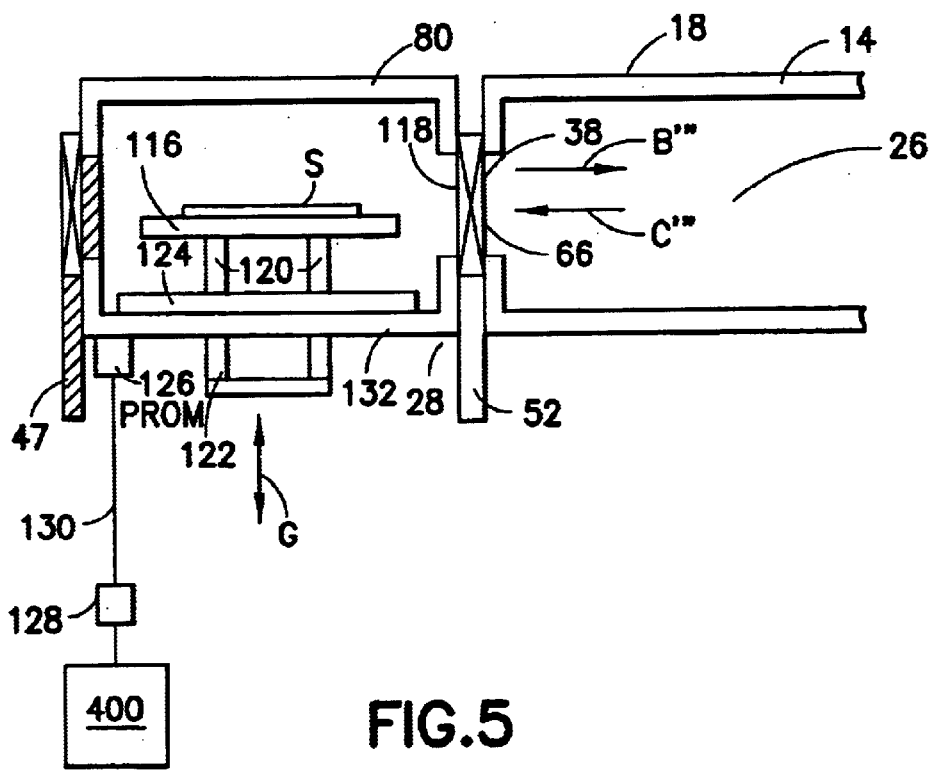
FIG. 5 is a fourth partial cross-sectional view of the back section having a fourth selectable configuration wherein a heater module is installed on the back section.

FIG. 5 shows still another cross-sectional view of the left integral chamber 28 of back section 14 wherein an active heater module 80 is mounted in the left chamber. The active heater module 80 is interchangeable with either the passive load lock module 74, the active load lock module 76, or the batch load lock module 78, and may be installed in either the left or right integral chambers 28, 30 of back section 14. Heater module 80 is shown mounted in the left chamber 28 for example purposes only. As seen in FIG. 5, the active heater module 80 may have one opening 118 which, when the module is dropped in chamber 28, is coincident with the internal opening 38 of the intermediate chamber 28 into the central chamber 26 of the back section. The active heater module 38 may not be able to operate as a load lock. Hence, when the active heater module 80 is loaded in one of the integral chambers 28, 30 of the back section 14, a load lock (e.g. passive load lock, active load lock, batch load lock) module 74–78 is preferably installed in the other integral chamber 28, 30. This allows substrates to be transported between the front and back sections 12, 14 (see FIG. 1) through one intermediate chamber 28, 30. The heater module 80 has a movable substrate support shelf 116 connected by shafts 120 to a drive section 122. The drive section 122 may be mounted to the bottom 132 of the module 80 and is capable of moving the shafts 116 up and down as indicated by arrow G in FIG. 5. The drive section 122 may include a hydraulically, or pneumatically powered poppet (not shown) or otherwise, an electric gear drive connected to shafts 120 for moving the shafts up and down. In the preferred embodiment, the heating module 80 has a heating plate 124 preferably disposed on the bottom 132 of the module. The heating plate may include heaters (not shown), such as for example electrically resistive heating elements, which are distributed in the plate 124 to provide a substantially uniform temperature distribution on the plate. In alternate embodiments the heating module may comprise a heating lamp or any other suitable heating device for heating the substrates S on the support shelves. The heating module 80 includes appropriate wiring 130 terminating in a connector 128 for connecting the controller 400 to the module 80 to control operation of the drive mechanism 122 and heating plate 124. The module 80 preferably also has a PROM 126 program to send a suitable signal to the controller 400, via wiring 130 indicating to the controller that the module in the left chamber is an active heater module 80. In response to the signal, the controller may load programming containing instructions for operating the substrate processing apparatus 10 with the heater module 80 in the left intermediate chamber 28 of the back section. By way of example, the controller 400 may load new substrates S from cassettes 22 on the front section 12 to the back section 14 through the load lock module 76 installed in the right intermediate chamber 30 (see FIGS. 1 and 3) as previously described. In the case where the substrate processing protocol employs substrate preheating, or post process heat soaking the substrates S are moved using vacuum substrate transport apparatus 34 into heating module 80 in chamber 28. The heating module 80 heats one substrate at a time. The substrate S is placed by end effector 68E of the substrate transport apparatus 34 into module 80 through opening 38 (as indicated by arrow C''' on FIG. 5) and placed on the movable substrate shelf 116. The shelf 116 is initially in an up position, as shown in FIG. 5. With the unheated substrate S on shelf 116, the controller 400 closes slot valve 66 isolating chamber 28 from central chamber 26. The controller 400 operates the drive mechanism 122 to lower shelf 116 to a position in which shelf 116 contacts heating plate 124 thereby forming a thermal conductive path between the substrate S and heating plate. The heating module 80 may be provided with appropriate plumbing (not shown) for introducing a small quantity of very low pressure gas between the heating plate 124 and shelf 116 to improve thermal conduction therebetween. The controller 400 activates the heating elements in the heating plate 116 to raise the temperature of the substrate S for a desired period of time. The shelf 116 may then be raised by the controller 400, and the slot valve 66 opened allowing the vacuum substrate transport apparatus 34 access to capture substrate S with end effector 68E, and withdraw the substrate S from the heating module 80 (as indicated by arrow B''' in FIG. 5) through opening 38. The substrate S may then be transported to one of the processing modules 36 for further processing, or to the load lock in the right chamber 30 for removal from the back section 14 an returned to the FOUP cassettes 22.

It is within the scope of the present invention that, the user of the substrate processing apparatus may select one of the interchangeable drop-in modules 74–80 for installation into either of the integral intermediate chambers 28, 30 of the back section 14 of the apparatus 10. The user may select to install the same kind of module 74–80 in both chambers 28, 30, or may select different modules 74–80 for installation into each of the chambers 28, 30. For example, the user may select a passive load lock module 74 to be installed in both left and right chambers 28, 30. Otherwise, the user may select to install a passive load lock module 74 in either left or right chambers 28, 30, and an active load lock module 76 or batch load lock module 78, or heater module 80 in the other chambers 28, 30. The user selects a desired interchangeable drop in module 74–80 in order to provide the substrate processing apparatus 10 with the desired performance characteristics. In the case where high throughput is desired from the processing apparatus 10, passive load lock modules 74 may be installed in both intermediate chambers 28, 30. This allows the substrate processing apparatus 10 to be able to generate a throughput of about 150 or more substrates per hour, or about 75 or more substrates per hour for a configuration with one passive load lock module. In the case where substrate cooling is desired, active load lock modules 76 may be installed in both chambers 28, 30 which may provide a through put of about 120 or more substrates per hour with cooling or about 60 or more substrates per hour if the active load lock module is installed in one chamber 28, 30. If batch pumpdown of processed substrates is desired, batch load lock module 78 may be installed in one or both chambers 28, 30. In the case where substrate preheating or post heating is desired, the heater module 80 is selected and installed in either the left or right chambers 28, 30 of the processing apparatus 10.

The present invention provides a processing apparatus 10 which has a vacuum chamber frame 19 with integral load-lock chambers 28, 30. Moreover, the integral load-lock chambers 28, 30 of the apparatus 10 can be independently configured by installing one from a number of different interchangeable drop-in modules 74–78, or by installing a drop-in heater module 80 in chambers 28, 30 to tailor the configuration of the apparatus to a desired performance characteristic. In contrast, processing apparatus of the prior art provide a modular capability only by having exterior load locks which are positioned adjacent to but are not part of (i.e. not integral to) the frame of the vacuum chamber. Thus, the apparatus of the prior art, by necessity, have a significantly larger footprint than the apparatus 10 with integral load-lock chambers 28, 30 of the present invention. In addition, the cost of manufacturing independent load-lock chambers and vacuum chambers is also greater (due to the additional material and labor needed to make separate independent chambers) than the cost for manufacturing a single frame 19 with integral load-lock and vacuum chambers 28, 30, 26 as in the present invention. The smaller footprint of the of the processing apparatus 10 allows a larger number of apparatus to be installed in a given substrate manufacturing plant and, in association with the lower cost per apparatus, provides a significant cost advantage in substrate manufacture in comparison to the apparatus of the prior art.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus, comprising:
   a frame defining a first chamber with outer substrate transport openings for transporting substrates between the first chamber and an exterior of the frame, the frame having at least one second integral chamber formed therein, the second integral chamber in the frame communicating with the first chamber through an internal substrate transport opening in the frame for transporting substrates between the second integral chamber and the first chamber of the frame;
   at least one processing module connected to the exterior of the frame and communicating with the first chamber of the frame through at least one of the outer openings;
   a substrate transport apparatus connected to the frame for transporting substrates between the first chamber of the frame and the processing module; and
   a predetermined interchangeable module removably connected to the frame and located in the second integral chamber of the frame, the predetermined interchangeable module being selectable from different interchangeable modules with different configurations for corresponding to a predetermined operation of the substrate processing apparatus.

2. A substrate processing apparatus in accordance with claim 1, wherein the predetermined interchangeable module in the second integral chamber of the frame is at least one of a passive load lock module, an active load lock module, a batch load lock module, or an active heater module.

3. A substrate processing apparatus in accordance with claim 1, wherein the substrate transporting apparatus is disposed at least in part in the first chamber of the frame for transporting substrates through the internal substrate transport opening between the second integral chamber and the first chamber of the frame, and through the outer opening between the first chamber and the processing chamber.

4. A substrate processing apparatus in accordance with claim 1, wherein the frame has a third integral chamber formed therein, the third integral chamber holding another predetermined interchangeable module removably mounted to the frame, and wherein the interchangeable module in the second chamber is mounted to the frame independently from the interchangeable module in the third chamber.

5. A substrate processing apparatus in accordance with claim 4, wherein the second and third integral chambers of the frame are side by side, the substrate transport apparatus being located in the frame for transporting substrates between the first chamber and the second chanter, and between the first chamber and the third chamber of the frame.

6. A method for configuring a substrate processing apparatus, the method comprising the steps of:
   providing the apparatus with a frame defining a first chamber with outer substrate transport openings for transporting substrates between the first chamber and processing modules outside the frame, the frame having a second integral chamber formed therein which communicates with the first chamber through an internal substrate transport opening in the frame;
   selecting, in accordance with a predetermined operating condition of the substrate transport apparatus, a predetermined interchangeable module from at least one of a passive load lock module, an active load lock module, a batch load lock module, and an active heater module; and
   installing the selected predetermined interchangeable module in the second integral chamber of the frame.

7. A method in accordance with claim 6, wherein the frame has third integral chamber formed therein, the third chamber being disposed side by side with the second chamber.

8. A method in accordance with claim 7, further comprising the steps of selecting another predetermined interchangeable module from at least one of a passive load lock module, an active load lock module, a batch load lock module, and an active heater module, and installing the selected module in the third integral chamber of the frame independently from the predetermined interchangeable module installed in the second integral chamber of the frame.

* * * * *